United States Patent [19]

Mallinson et al.

[11] Patent Number: 5,321,404
[45] Date of Patent: Jun. 14, 1994

[54] RIPSAW ANALOG-TO-DIGITAL CONVERTER AND METHOD

[75] Inventors: A. Martin Mallinson, Billerica; Peter R. Holloway; Geoffrey P. O'Donoghue, both of Andover, all of Mass.; Charles H. Ayres, Plaistow, N.H.

[73] Assignee: Analog Devices, Inc., Norwood, Mass.

[21] Appl. No.: 19,572

[22] Filed: Feb. 18, 1993

[51] Int. Cl.$^5$ ............................................. H03M 1/56
[52] U.S. Cl. .................................... 341/169; 341/166; 341/141
[58] Field of Search ............... 341/141, 166, 167, 168, 341/169, 170

[56] References Cited

U.S. PATENT DOCUMENTS

| | | | |
|---|---|---|---|
| 3,943,466 | 3/1976 | Lyghounis | 341/170 |
| 3,961,325 | 6/1976 | Kendall et al. | 341/167 |
| 4,064,515 | 12/1977 | Mashimo et al. | 341/169 |
| 4,088,993 | 5/1978 | LeCardonnel et al. | 341/170 |
| 4,940,982 | 7/1990 | Gulczynski | 341/169 |

OTHER PUBLICATIONS

Fink and Christianse, ed, Electronics Engineer's *Handbook*, McGraw-Hill, 1989, pp. 3.42–4.43, 8.69–8.77, 16.63–16.67.
Talambiras, "Some Considerations in the Design of Wide-Dynamic Range Audio Digitizing Systems", *Proc. Audio Engineering Society* 57th Cov., May 10, 1977 pp. 164–170.
1988 Analog Devices Data Book, pp. 3.13–3.22.

*Primary Examiner*—Howard L. Williams
*Attorney, Agent, or Firm*—Koppel & Jacobs

[57] ABSTRACT

An analog-to-digital converter (ADC) generates multiple analog waveforms, preferably as voltage ramps, that progressively increase in signal value over time but at different rates of increase. The ramp with the greatest slope is initially compared with an input signal sample until the ramp exceeds the sample, at which time the system switches to the ramp with the next greatest slope for comparison with the input. The operation then repeats, with the system switching to the next lower ramp each time the current ramp exceeds the input. Both the number of ramp switching events that occur during a sample cycle, and the clock count at the time of the most recent ramp switch, are recorded and used respectively as the most and least significant bits of a digital output. The switching event count proceeds from an initial maximum value from which it subtracts at each switching event, while the clock count builds up from an initial minimum value.

30 Claims, 5 Drawing Sheets

RIPSAW ANALOG-TO-DIGITAL CONVERTER AND METHOD

BACKGROUND OF THE INVENTION

1. Field of the Invention

This invention relates to analog-to-digital converters (ADCs) and related conversion methods, and more particularly to ADCs that are adaptable to multiple-channel analog inputs.

2. Description of the Related Art

Numerous different ADC architectures are available, such as successive-approximation, flash, dual-ramp and staircase devices. Such converters are described in general in Fink and Christiansen, ed, *Electronics Engineer's Handbook*, McGraw-Hill, 1989, pages 3.42–3.43, 8.69–8.77, 16.63–16.67.

One of the limitations of presently available ADCs is the difficulty in providing monolithically integrated converters with a multi-channel input capability. Monolithic integration would be very helpful in applications which have stringent noise, power, space and performance requirements. Without such integration, cost considerations can dictate that only a single ADC be used to service multiple channels. In this event, the ADC is multiplexed among the different channels, which typically number 16. This is the approach taken in Talambiras, "Some Considerations in the Design of Wide-Dynamic-Range Audio Digitizing Systems", Proc. Audio Engineering Society 57th Conv., May 10, 1977, pages 164–170, and also in the 1988 Analog Devices Data Book, pages 3.13–3.22 for the AD368/AD369 converters. Both of these references multiplex successive approximation converters. This requires a large amount of power, and it is difficult to monolithically integrate the multiplexer, programmer and analog-to-digital function as indicated in the two references on the same chip.

SUMMARY OF THE INVENTION

The present invention seeks to provide an ADC and associated conversion method that operate at low noise and power levels, and are sufficiently low cost and integratable that separate converter channels can be integrated on a single chip.

The preferred embodiment of the new ADC employs a ripsaw ramp generator that produces multiple voltage ramps of progressively greater voltage-time slopes; both the ramp generator and the overall converter are inherently monotonic. The ramps are incremented at a desired clock rate, with the first ramp initially compared with a sample obtained from an input analog signal. When the ramp becomes greater than the input sample, the system switches to select the ramp with the next greatest slope for comparison with the input sample. At the same time a record is stored that a switching operation has occurred, and the clock count at the time of the switching event is stored. The process then repeats, with the system switching to ramps with progressively lesser slopes each time the current ramp exceeds the input sample, and storing the most recent switch number and clock count.

At the end of an operating cycle, which corresponds to the sample rate, the stored switch and clock counts are read out as the desired digital output. For this purpose the switching event counter is preset to a maximum value from which it counts down for each switching event, while the clock counter is preset to a minimum value from which it counts up. The stored switching event and clock counts are read out as the most and least significant bits of the output digital signal, respectively. The output can be in either a floating point binary or a fixed point formational amplifier (op amp) with an inverting feedback capacitor and an R-2R resistance ladder at its output. A charging circuit consisting of two equal value capacitors, one of which charges up while the other discharges into the op amp's feedback capacitor, provides equal charge increments to the feedback capacitor at each clock signal; the matched capacitors alternate between charging and discharging under the control of the clock. The ramp with the maximum slope is developed at the op amp output, with the other ramps taken from progressively voltage decremented taps of the R-2R ladder circuit.

To obtain an accurate conversion for low level input signals, a special routine is entered in the event the ramp with the greatest slope exceeds the input signal at the first clock count. This identifies a low level input, in response to which the system shifts immediately to the lowest level ramp, skipping the intervening ramps. Furthermore, to guard against false switching events that could occur if the system does not respond rapidly enough to a given switching situation, a second ramp switch is inhibited for the second of any two consecutive switch signals.

Separate ADCs can be monolithically integrated with respective input circuitry on the same IC chip to accommodate multiple input channels. Further economies can be achieved by providing a common ramp generator and clock counter for each of the separate ADCs.

These and other features and advantages of the invention will be apparent to those skilled in the art from the following detailed description, taken together with the accompanying drawings.

DETAILED DESCRIPTION OF THE INVENTION

The invention provides a new approach to analog-to-digital conversion in which the output digital value is based upon a comparison between an input analog sample and a sequence of voltage waveforms that progressively increase in signal value over time, but at different rates of increase. The voltage waveforms are preferably linear ramps, but other waveforms could also be used so long as they are known in advance. A digital output is produced based upon the successive comparisons.

Figure 1:
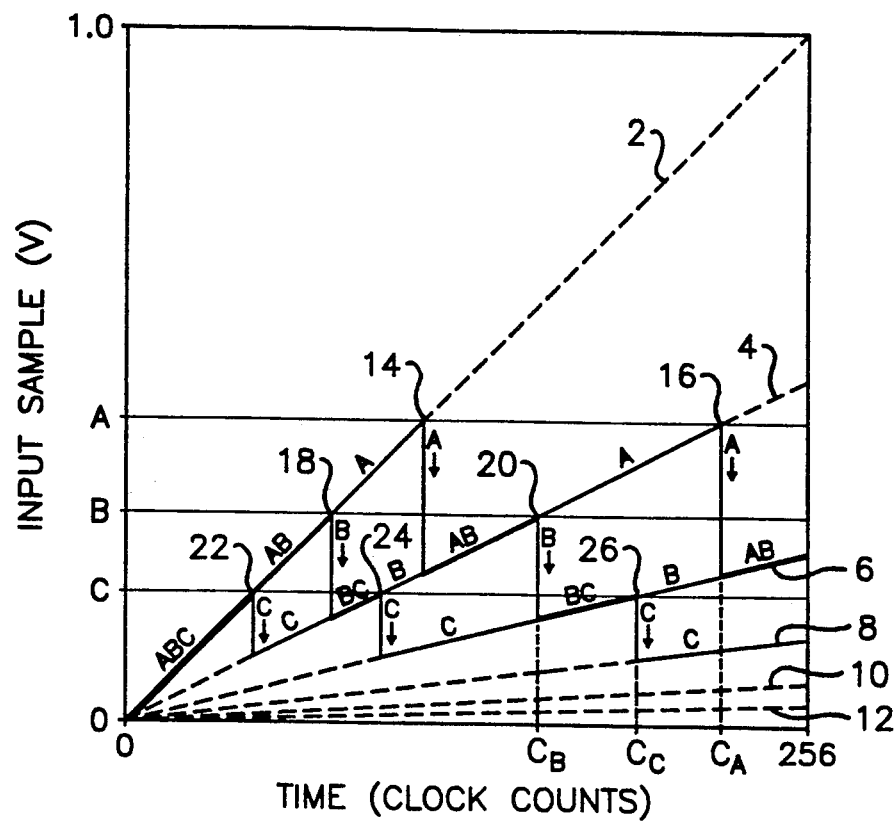
FIG. 1 is a diagram illustrating the operation of the invention for three specific input signal levels.

The operation of the preferred embodiment is illustrated in FIG. 1. It assumes an input sample within a one volt range, with the conversion process for a given sample extending over a time period of 256 clock counts. One of the advantages of the preferred embodiment is that it is based upon the number of clock counts during the conversion cycle, and is not dependent upon the actual clock frequency.

A number of different voltage ramps are generated over time, beginning at the lower left hand origin of FIG. 1 and progressing up and to the right with time. Six different ramps 2, 4, 6, 8, 10 and 12 are shown for purposes of illustration, but for many applications eight ramps would be desirable. There is preferably a binary relationship between the ramp slopes, i.e., the voltage-time slope for the highest order ramp 2 is twice the slope of ramp 4, which in turn is twice the slope of ramp 6, and so on down to the lowest order ramp 12. Each ramp voltage progresses up its respective ramp path in equal voltage increments, one increment for each clock count. Although the voltage increments are periodic rather than continuous, and thus actually produce waveforms with a small staircase pattern, each individual increment is small enough that, together with smoothing effects from RC time constants associated with the R-2R ladder (described below), for practical purposes the waveforms can be considered to be linear ramps.

The operation of the invention is illustrated for three different input sample signal levels A, B and C. Starting first with signal A, this input is first compared with the signal building up along the highest order ramp 2. When the ramp signal has built up to the level of signal A, at point 14, the system reverts to the second highest order ramp 4 and begins comparing the ramp 4 signal with the input signal A. When the ramp 4 signal meets signal A, at point 16, the system again drops down to the next lower order ramp, which is ramp 6. Since ramp 6 is still below input level A at the end of the cycle, there is no further ramp switching. The system records two features of the described process, which are used to generate a digital output that corresponds to the input signal level A: the number of times the system switched to a lower ramp (twice), and the clock count number at which the last ramp switch occurred ($C_A$).

Assume now that the input voltage sample is at level B, which is somewhat lower than the first input signal A. The ramp signals will begin to build up, as before. However, the highest order ramp 2 will reach level B at point 18, which occurs at a lower clock count than for the higher input A. At point 18 the system shifts to the second highest order ramp 4, and compares ramp 4 with the input signal until the input signal is again reached at point 20. A switch is then made to the third ramp 6, and the comparison remains between input B and ramp 6 for the remainder of the cycle. It should be noted that, at the end of the cycle, two ramp switches will have occurred for input B, the same as for input A. However, the last ramp switch for input B occurred at a clock count $C_B$ corresponding to point 20, which is a lower count than the stored clock count $C_A$ for input A.

Finally, assume that the input sample is at a still lower voltage level C. The initial comparison with ramp 2 proceeds until the ramp meets level C at point 22, at which time the system switches to the next ramp 4. This ramp reaches level C at point 24, causing a shift down to ramp 6. This third ramp meets level C at point 26, and a shift is made to the fourth highest order ramp 8; this remains the comparison ramp for the remainder of the cycle because it does not reach level C before the cycle ends. Note that three ramp switches have occurred for input C, as compared to two switches each for inputs A and B. Furthermore, the last ramp switch for input C occurred at clock count $C_C$, which is located between clock counts $C_A$ and $C_B$.

Continuing this process for additional input sample levels would reveal that the number of ramp switching events increases as the input level goes down, while for an equal number of ramp switching events the clock count at the last switching event decreases as the input level goes down. Thus, the number of switching events can be used as a gross indication of the input signal level, with the clock count for the last switching serving as a finer indication of the input level for two inputs that produce an equal number of switching events.

This phenomenon is used in the invention by assigning the number of ramp switching events to the most significant bits of the output digital signal, and the clock count at the last switching event to the output's least significant bits. For example, eight different ramps can be identified by three digital bits, while 256 clock counts can be identified by eight digital bits. Thus, a digital output with eleven bit representation can be obtained, with the three most significant bits determined by the number of ramp switching events, and the eight least significant bits determined by the clock count at the time of the last switching event. Since the number of switching events drops as the input signal level goes up, the three most significant bits would initially be set at a maximum value (111), and then decremented downward for each successive switching event. The clock count for the most recent switching event increases as the input level goes up (for an equal number of switching events), so the eight least significant bits would initially be set at a minimum value (00000000), and incremented up for each successive clock count.

Figure 2:
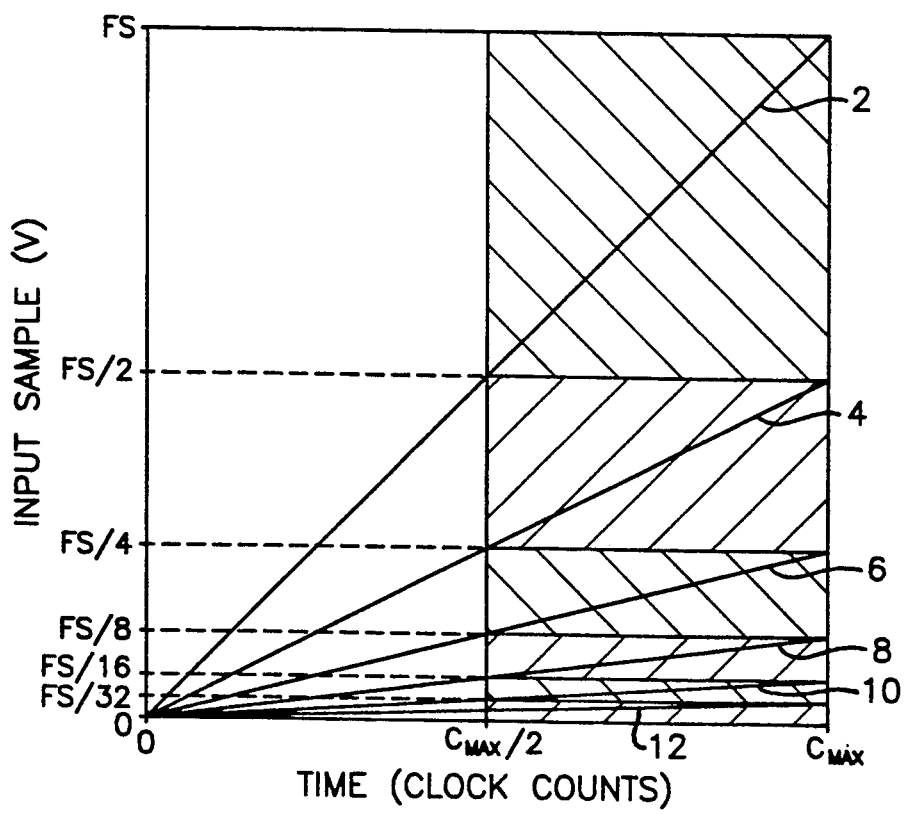
FIG. 2 is a diagram illustrating the input signal ranges that correspond to each of the ramp waveforms employed in the invention.

FIG. 2 illustrates the input sample ranges that correspond to the various voltage ramps. A full scale input signal is indicated as level FS, with the highest order ramp 2 reaching this full scale level at the maximum clock count $C_{MAX}$ within the operating cycle. Assuming that the ramp slopes are binarily decremented, as in FIG. 1, the second highest order ramp 4 reaches FS/2 at $C_{MAX}$, the third ramp 6 reaches FS/4 at $C_{MAX}$, the fourth ramp 8 reaches FS/8 at $C_{MAX}$, etc.

For any input sample between FS and FS/2 only one ramp switching event will occur, from ramp 2 to ramp 4, and the cycle will end with ramp 4 active. For an input sample between FS/2 and FS/4, two ramp switches will occur, and ramp 6 will be the last active ramp. Similarly binarily decremented signal ranges can be established for the remaining ramps.

It can be observed from an inspection of FIGS. 1 and 2 that, for any input sample between 0 and FS, the last ramp switching event will occur at a clock count no less than $C_{MAX}/2$ (except for the lowest gain range, as discussed below). Thus, for an operating cycle of 256 clock counts, only the last 128 of the possible clock counts will actually be used in this example to provide the lower order resolution for the output digital signal. However, eight bits of resolution will still be obtained from the clock count, since the most significant of the clock count bits will be set on 1 to indicate that the clock count is at least equal to 128.

Figure 3:
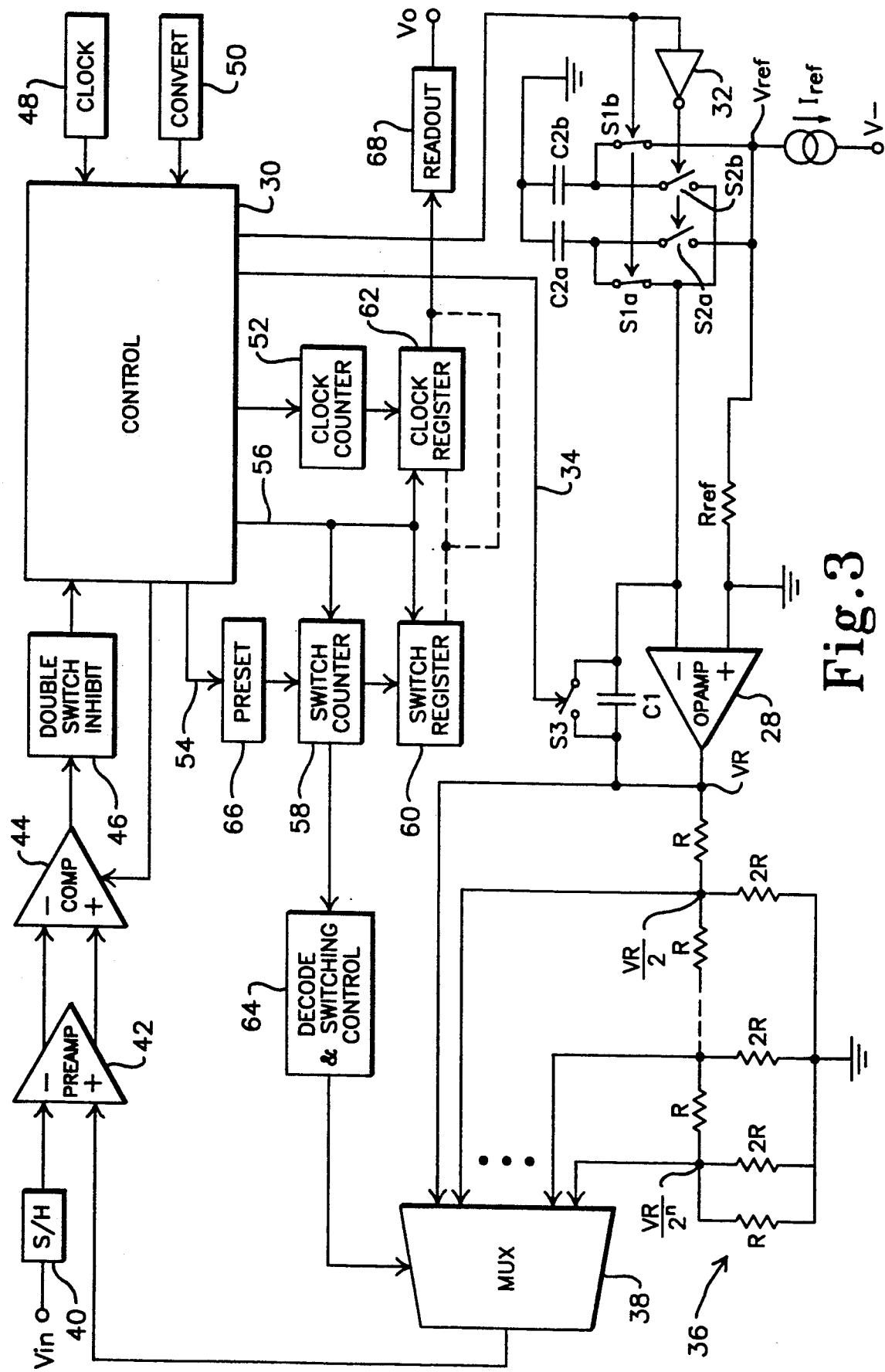
FIG. 3 is a partially block and partially schematic diagram showing an implementation of the invention.

A circuit that can be used to implement the conversion scheme of FIG. 1 is shown in FIG. 3. The ramp generator includes an operational amplifier (op amp) 28 with a feedback capacitor C1 connected between its output and its inverting input, and its non-inverting input connected to ground and a reference resistor Rref. Equal charge increments are applied to C1 at regular periods, developing a voltage ramp waveform at the output of op amp 28, by a charging circuit that includes a pair of matched charging capacitors C2a and C2b. The two charging capacitors are operated in tandem, with one discharging into C1 while the other recharges. The alternation between the two charging capacitors is governed by a switching network that alternates the charging capacitor connections between the op amp's inverting input, and a negative voltage node Vref that is produced by a current source Iref drawing a current through the reference resistor Rref to a negative voltage supply V-; the other sides of the charging capacitors are grounded. Switches S1a and S1b connect charging capacitors C2a and C2b to the op amp's inverting input and to Vref, respectively, when they are closed. The opposite switching connections, with C2a connected to Vref and C2b connected to the op amp's inverting input, are established when S/a and S/b are opened and a second pair of switches S2a and S2b are closed. Switch actuating signals are provided by a control circuit 30. A switch control signal is applied directly to switches S1a and S1b, causing them to assume the same switching state, while the switching control signal is applied through an inverter 32 two switches S2a and S2b, causing them to assume switching states opposite to S1a and S1b. The switch control signal is reversed at a predetermined clock rate, with the feedback capacitor C1 receiving a charge from the charging capacitor that is connected to the op amp's inverting input, and the other charging capacitor recharging through its connection between ground and the negative voltage node Vref.

In a particular embodiment, the feedback capacitor C1 is a 100pF device, the charging C2a and C2b are each 1pF, Rref is 6.25 kohm and Iref is 100 microamps. Each incremental charging of the feedback capacitor causes the op amp's output voltage to ramp up approximately linearly. At the end of a sample period, for example 256 clock counts, the voltage ramp is reset by closing a switch S3 across the feedback capacitor C1 to discharge the capacitor; the switch is operated by a signal transmitted from the control circuit 30 over a control line 34.

The voltage ramp at the op amp output is decremented to a series of lower order voltage ramps preferably by an R-2R resistance ladder 36. Such ladders are well known, consisting of a number of series-connected resistors of resistance value R, with a shunt resistor of resistance value 2R connected between each series resistor and a reference voltage level (ground in the present example). A termination resistance of value R is used to maintain the desired resistance decremention. The ladder acts as a voltage divider, with the voltage at the input to each successive series resistor equal to half the voltage at the input to the previous series resistor. Thus, for a ramp voltage VR at the op amp output, the voltage at the input to the second step will be VR/2, the voltage at the input to the third step will be VR/4 and so forth until the last step, at which the voltage is $VR/2^{n-1}$, where n is the number of steps.

The various ramp voltages are applied to a multiplexer 38, which selects a particular one of the ramps for comparison with an input voltage signal. A sample of the input analog voltage Vin is acquired by a sample-and-hold circuit 40, with the input sample applied to the inverting input and the selected ramp signal applied to the non-inverting input of a preamplifier circuit 42. The preamplifier in turn provides a differential signal, representing the difference between the selected voltage ramp and the input sample, to a comparator 44. Since the input sample and the selected ramp will often initially be quite far apart, which could cause the comparator to saturate, the preamplifier clips the input differential to a maximum level to prevent saturation, preferably about 20–30 mV, and provides a linear ramp input to the comparator when the ramp-sample differential is less than the saturation level.

The comparator output is provided to the control circuit 30 through a "double switch inhibit" routine 46, the purpose and function of which is described later. A clock 48 provides periodic clock signals to the control circuit at a desired clock rate, such as 7 MHz for the present example. The clock signal is routed to various locations by the control circuit 30, including the comparator 44. Placing the comparator in an active mode only during the application of a clock signal reduces the overall power dissipation, which is an important factor in monolithic integration. Instead of a strobed comparator, however, a linear comparator followed by a flip-flop circuit could be used.

Figure 4:
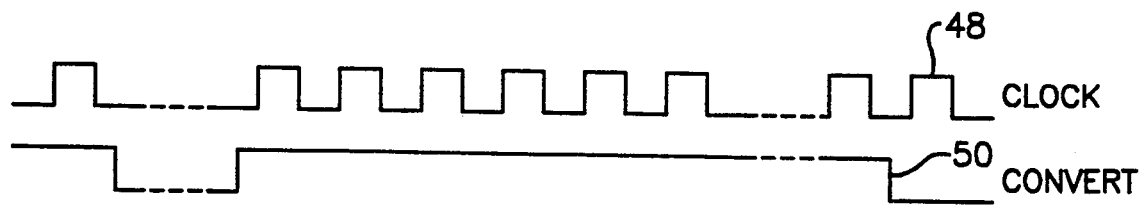
FIG. 4 is a timing diagram for clock and convert signals used in the FIG. 3 circuit.

The control circuit 30 also received a "CONVERT" signal input 50 at the beginning of each analog-to-digital conversion cycle, when a new sample is acquired by sample-and-hold circuit 40. The clock and convert signals are illustrated in FIG. 4, from which it can be seen that the clock signal runs continuously while the convert signal is applied at the beginning of a new sample, remains high for the duration of the sample, and then goes low until a new sample has been acquired. In the example described thus far, the convert signal would be high for 256 clock pulses.

Referring back to FIG. 3, the control circuit also routes the input clock signals to a clock counter 52, which accumulates the number of clock counts from the beginning of the operating cycle when the convert signal goes high. When the ramp signal exceeds the sample threshold provided to the comparator 44, a pulse is produced on output lines 54 and 56 from the control circuit 30. Since the ramp builds up in discrete increments, it will normally not reach a level exactly equal to the input sample, but rather will increment from the level slightly below to a level slightly above the input threshold during a single clock count. However, in case the ramp signal does build up to a level exactly equal to the input sample, that may be taken as the ramp having exceeded the comparator's threshold.

The signal on line 56 from the control circuit is applied to a switch counter 58, a switch register 60 and a clock register 62. In response to the received control signal, the switch counter 58 actuates a decode and switching control circuit 64 that causes the multiplexer 38 to switch from the prevailing ramp and instead select the next highest order ramp. For example, referring to the switching scheme of FIG. 2, actuating the decode and switching control circuit 64 causes the multiplexer to switch from the FS ramp 2 to the FS/2 ramp 4 for the first switching event, and from the FS/4 ramp 6 to the FS/8 ramp 8 for the third switching event, etc. The number of switching events is recorded in the switch counter 58. As mentioned previously, since the switch count provides the most significant bits of the output digital signal, the switch counter 58 is initially preset to a maximum count (111 for a three bit counter), and counts down from that level for each successive switching event.

The switch register 60 is loaded with the latest ramp switch count from counter 58 under the control of the pulse on line 56. This pulse also causes the clock register 62 to load the clock count held by the clock counter 52 at the time of the last ramp switching event. Thus, at any given time the switch register 60 stores the number of switching events (counting down from an initial maximum value), and the clock register stores the clock count at the time of the most recent switching event.

The output line 54 from control circuit 30 provides an input to a preset logic circuit 66 that accelerates the ramp switching for low input sample levels. If the input sample is low enough (not more than one-half the total range of the lowest order FS/128 ramp range for the example described herein), the sample will be exceed by the FS ramp at the first clock count. If this occurs, it is known that the input signal is within the range of the lowest order ramp. Under normal operation, in which the multiplexer would skip down by one ramp at each clock count, it would take eight clock counts to reach the final ramp. In response to its sensing that the input sample value is within the final ramp's range, the preset logic circuit 66 causes the switch counter 64 to skip over the intervening ramps and jump from the highest order FS ramp directly down to the lowest order FS/128 ramp. Thus, the system is operating on the final ramp at the time of the second clock count. If, on the other hand, the highest order FS ramp does not exceed the input voltage sample after the first clock count, the preset logic circuit 66 initially sets the switch counter 58 to a maximum value 111.

The double switch inhibit circuit 46 may be provided to account for the possibility of unintended delays in the circuit operation that could prevent the multiplexer 38 from settling at the next lower ramp by the time a new clock signal is received following a switching event. If this happens, the comparator 44 will still see the higher order ramp at the time of the second clock signal, and will produce a second switching output. However, since each new ramp requires more than a single clock count to reach the input sample level following a switching event, a second switching signal in a row is invalid. To prevent the system from responding to two switch signals in a row, the first of which is valid and the second of which stems from system delays, the double switch inhibit circuit 46 tests for the presence of switch signals at the comparator output for two consecutive clock cycles and disregards the second signal; only the first signal is forwarded to the control circuit 30. A third consecutive switch signal would also generally be disregarded, but a second ramp switch could be made in response to a fourth consecutive switch circuit since the circuitry can generally be expected to be well settled to a switching event in not more than two additional clock counts.

The switch and clock registers 60 and 62 are parallel load shift registers. At the end of the sample period, the two registers are daisy-chained together and read out as an eleven bit register by appropriate readout circuitry 68, with the count stored in clock register 62 read out as the least significant bits and the count stored in switch register 60 as the most significant bits of the output digital signal. The registers 60 and 62 do not have to be reset at the end of the sample cycle, since they are automatically reloaded at the first switching event of the following cycle.

Figure 5:
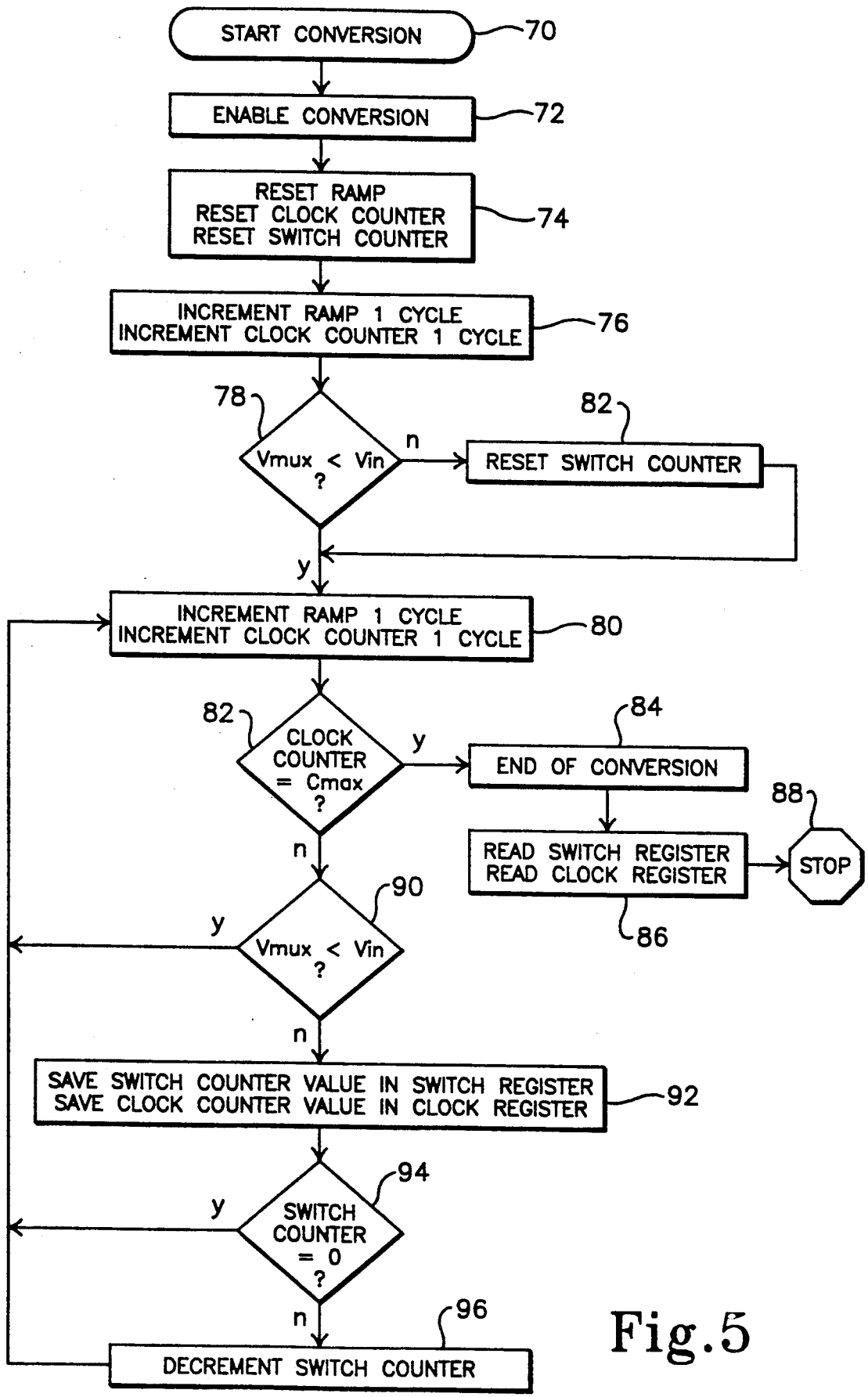
FIG. 5 is a logic flow diagram illustrating the operation of the FIG. 3 circuit.

A logic flow diagram that illustrates the system operation described thus far is presented in FIG. 5. At the beginning of an analog-to-digital conversion sample cycle (block 70) an enable conversion signal 72 is provided by the CONVERT input 50 to the control circuit 30. This causes the multiplexer to reset to the highest order ramp, resets the clock counter 52 to an initial 0 count, and presets the switch counter 58 to an initial maximum count (block 74). At the first clock cycle, the highest order ramp is incremented by one clock cycle, and the clock counter 52 is also incremented by one clock cycle (block 76). A comparison is made between the ramp voltage selected by the multiplexer (Vmux) and the input sample signal Vin (decision block 78). If the ramp voltage selected by the multiplexer is less than the input voltage after the first clock signal, the next clock signal causes both the ramp and the clock counter to increment by another clock cycle (block 80). If, however, the ramp signal selected by the multiplexer is not less than the input signal at the first clock count, the acceleration mode is entered in which the switch counter 58 is reset to a minimum value (block 82) before proceeding to the ramp and clock counter increment of block 80.

At the end of each subsequent clock signal, the contents of the clock counter 52 are accessed to determine whether the maximum clock count at the end of the sample signal (256 for the example given herein) has been reached (decision block 82). If it has, the end of the conversion cycle is indicated (block 84), and the contents of the switch register 60 and clock register 62 are read out (block 86). The system then goes into a STOP mode 88 until the next CONVERT signal is received at the beginning of the next sample cycle.

Assuming the maximum clock count has not yet been reached, the ramp signal following the most recent ramp increment is compared with Vin (decision block 90). If the ramp signal is less than Vin, the system loops back to block 80 to again increment the ramp and clock counter. If the ramp signal is not less than Vin, indicating the ramp has reached the input signal level, the current switch counter and clock counter values are stored respectively in the switch register and clock register (block 92). The switch counter is then examined to determine whether it has reached its minimum value (decision block 94). If it has not, it is decremented by one unit (block 96), and the system returns to block 80 to again increment the ramp and clock counter. If the switch counter has reached its minimum value, the system returns directly to block 80 without attempting to again decrement the switch counter.

While a particular circuit is illustrated in FIG. 3 for generating multiple ramps, numerous other circuits to accomplish this function could be envisioned. For example, multiple current sources could be used to charge respective capacitors, although this would tend to be noisier and harder to control. Furthermore, it is not necessary that all of the ramps be generated simultaneously. Only a single ramp at a time could be generated. Following the first ramp, a ramp with a lesser slope could be generated and the first ramp extinguished when the first ramp exceeds the input signal. The generation of new ramps could proceed in a ripsaw pattern as illustrated in FIG. 1, progressing from ramp to ramp as each new ramp exceeds the input. This type of waveform could be produced with a digital-to-analog converter (DAC). Alternately, a jump to a next-to-final ramp slope could be made, depending upon the number of clock counts before the first ramp exceeds the input. For example, referring to FIG. 2, with an input signal between FS/8 and FS/4 the first ramp 2 will exceed the input signal between the clock counts $C_{MAX}/8$ and $C_{MAX}/4$. If the first ramp switching event is noted during this time interval, a jump can immediately be made to ramp 6, skipping ramp 4. Only one additional jump would be made, to ramp 8, to obtain a clock count from which (together with the identity of the ramp to which the system switched from ramp 2 or the time at which the switch was made) the input signal level can be determined. This last approach is applicable to either a simultaneous multi-ramp generator, or to a system in which only a single active ramp at a time is generated. It would not even require a shift to ramp 8, since the clock count at the time ramp 6 exceeds the input signal is the critical factor; it would be known that ramp 8 would not exceed the input level, so ramp 8 could be deleted.

Figure 6:
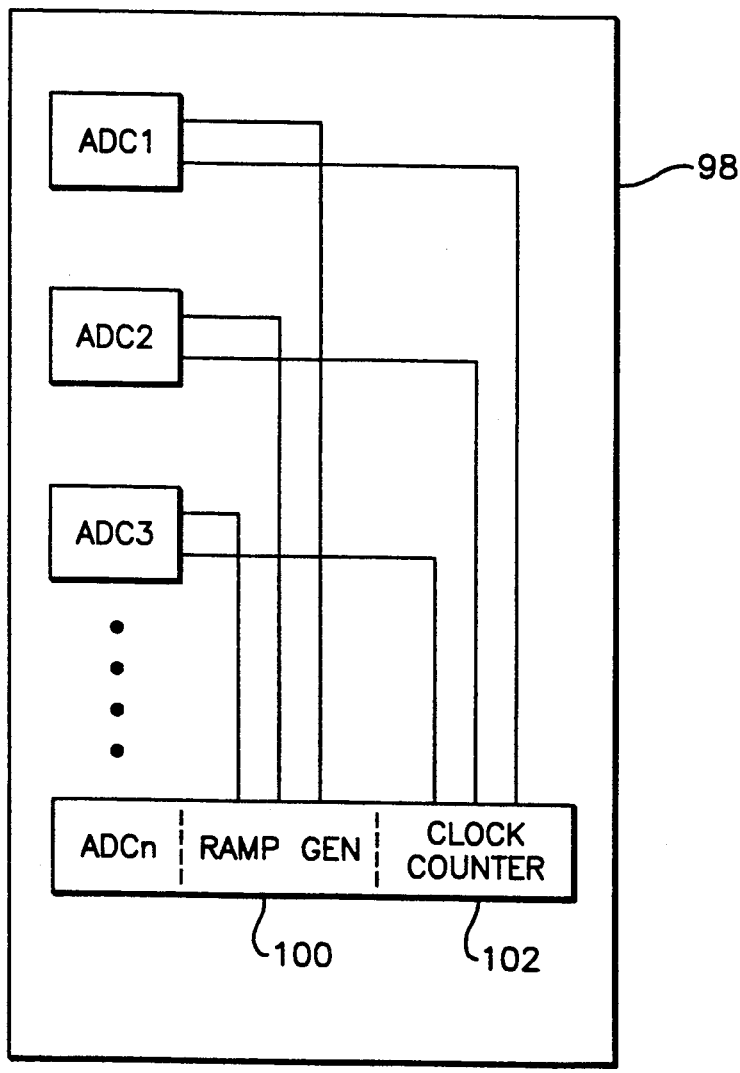
FIG. 6 is a block diagram of a multi-channel ADC system in accordance with the invention.

One of the advantages of the invention is that it allows for an economical multi-channel conversion system. All of the elements of the converter described above can readily be monolithically integrated on a single inexpensive chip. If multi-channel service is desired, it is economical to provide a separate conversion circuit for each channel, with all of the conversion circuits on the same chip. This is a considerable improvement over the prior multiplexing of multiple channels into a single ADC, which was dictated in the past by cost considerations. The new approach is illustrated in FIG. 6 in which n ADCs, including input sampling and conditioning circuitry, are monolithically integrated on a single IC chip 98. A ramp generator circuit 100 and clock counter 102 need be provided on only one of the ADCs, since their outputs can be shared with each of the other channels.

Figure 7:
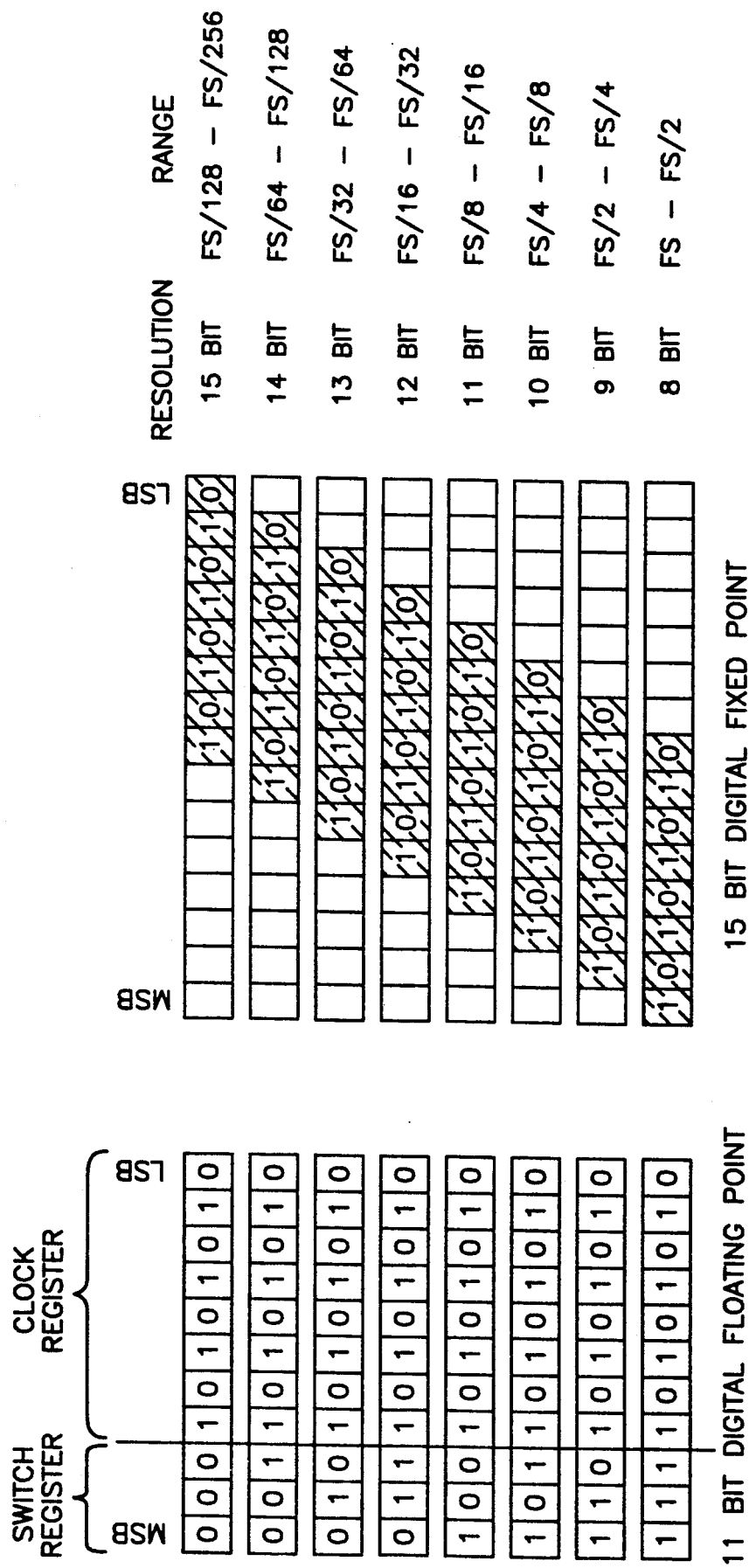
FIG. 7 is a diagram illustrating different possible digital output formats.

The digital output can be obtained in either a floating point or a fixed point format. Examples of these two output formats are given in FIG. 7. The use of 8 binary ramps corresponds to an 11 bit floating point or a 15 bit fixed point format, with a resolution varying from 8 bits to 15 bits depending upon the magnitude of the input signal. For example, assume that the input signal is in the FS-FS/2 range of FIG. 2. Since this range (FS/2) is divisible into 128 parts, corresponding to possible clock counts 129 through 256, the resolution is $FS/2 \div 128 = FS/256 = FS/2^8$, which corresponds to 8 bit accuracy. The floating point and fixed point output formats for a signal within this range that produces a digital clock count of 10101010 are illustrated in the last line of FIG. 7.

If the input signal is in the FS/2-FS/4 range of FIG. 2, the output resolution is 9 bits. This is because the output range is still divisible into 128 parts, but the range has been reduced to FS/4. Thus, the resolution is $FS/4 \div 128 = FS/512 = FS/2^9$, or 9 bits. The corresponding floating point and fixed point formats are illustrated in the next to last line of FIG. 7. Similarly, if the input signal drops to the FS/4-FS/8 range of FIG. 2, the output resolution is 10 bits, corresponding to $FS/8 \div 128 = FS/1024 = S/2^{10}$; the floating point and fixed point formats are given in the third to last line of FIG. 7. Continuing with the same analysis for each of the input signal ranges of an 8 ramp system yields a final signal range FS/128-FS256 with a 15 bit output resolution, whose floating point and fixed point formats are given in the top line of FIG. 7.

While particular embodiments of the invention have been shown and described, numerous variations and alternate embodiments will be apparent to those skilled in the art. For example, while the invention has been described in terms of a positive input voltage, it is also applicable to negative inputs. In the case of a negative input, the operation would be the same but negative-going ramps would be generated. Thus, the description of a ramp as "increasing" over time refers to an increase in its absolute value. Accordingly, it is intended that the invention be limited only in terms of the appended claims.

We claim:

1. An analog-to-digital converter (ADC) for converting an analog input signal to a digital output signal, comprising:
    a waveform generator for generating multiple signal-time analog waveforms that progressively increase in signal value over time but at different rates of increase,
    a threshold circuit that establishes a signal threshold level associated with the input signal,
    a waveform selector that selects a waveform for presentation to said threshold circuit, said waveform selector initially selecting the waveform with the highest rate of increase and then switching to waveforms with progressively lower rates of increase in response to each selected waveform exceeding said threshold level, and
    an output circuit for generating a digital output that corresponds to the rate at which said waveform selector switches between different waveforms.

2. The ADC of claim 1, wherein said waveform generator generates said waveforms as substantially linear ramps with different signal-time slopes.

3. The ADC of claim 2, said waveform generator including a circuit for generating the ramp with the greatest slope, and a signal decrementing circuit for decrementing the greatest slope ramp into ramps with progressively lower slopes.

4. The ADC of claim 3, said signal decrementing circuit comprising an R-2R ladder network.

5. The ADC of claim 3, said circuit for generating the ramp with the greatest slope comprising an operational amplifier having a non-inverting input connected to a voltage reference and an inverting input connected to its output through a feedback capacitor, and a charging circuit for charging said feedback capacitor with substantially equal charge increments at a predetermined clock rate.

6. The ADC of claim 5, said feedback capacitor charging circuit comprising a pair of matched charging capacitors, a charging circuit for said charging capacitors, and a switching network for connecting one of said charging capacitors at a time for charging by its charging circuit and the other of said charging capacitors for discharging into said feedback capacitor, and for alternating the switched connections of said charging capacitors at said clock rate.

7. The ADC of claim 1, further comprising a sample-and-hold circuit connected to present successive samples of said input analog signal to said threshold circuit at a predetermined sampling rate, and a control circuit that cycles the operation of said waveform generator at the same sampling rate.

8. The ADC of claim 7, wherein said threshold circuit establishes said threshold level equal to the prevailing sample level.

9. The ADC of claim 7, said output circuit including a first storage element for storing the number of switching operations by said waveform selector during a given cycle, and a readout circuit for reading out the contents of said first storage element as the most significant bits of the digital output.

10. The ADC of claim 9, said control circuit including a clock that generates clock signals at a predetermined clock rate to control the operation of the waveform generator, and said output circuit including a second storage element for storing the clock count at the most recent switching operation of said waveform selector prior to the end of a cycle, said readout circuit reading out the contents of said second storage element as the least significant bits of the digital output.

11. The ADC of claim 1, further including an acceleration circuit which controls said waveform selector to skip at least some of said waveforms when switching to a lower waveform in response to the highest waveform exceeding said threshold level within a predetermined time period.

12. The ADC of claim 11, further including a clock that generates periodic clock signals to actuate the waveform generator, wherein said acceleration circuit controls said waveform selector to skip to the lowest order waveform in response to the highest waveform exceeding said threshold level for the first clock count.

13. The ADC of claim 1, implemented as a multichannel converter with other similar ADCs for converting multiple analog input channels to respective digital outputs simultaneously, wherein a common waveform generator is used for each of said ADCs.

14. The ADC of claim 1, further including a clock that generates clock signals to synchronize the operation of the remainder of the ADC, and a waveform switch inhibit circuit that inhibits the waveform selector from switching to a lower waveform in response to the second of two consecutive switch signals from the threshold circuit.

15. The ADC of claim 1, wherein said waveform generator generates said multiple analog waveforms simultaneously.

16. The ADC of claim 1, wherein at any given time said waveform generator generates only the waveform selected by said waveform selector.

17. An analog-to-digital converter (ADC) for converting successive analog voltage samples of an input analog signal to a digital output, comprising:
a clock that generates periodic clock signals,
a ramp generator that operates in response to a clock signal to generate a plurality of voltage ramps that increase over time at different slopes,
a comparator connected to receive a signal that represents the input sample as a sample,
a multiplexer connected to select among said voltage ramps,
a ramp connect circuit for supplying a signal representing the selected voltage ramp as a ramp input to said comparator, said comparator producing a ramp switch signal in response to its ramp input exceeding its sample input,
a clock counter for counting clock signals,
a digital clock register for storing a clock count supplied by said clock counter,
a ramp switch signal counter for counting the number of ramp switch signals produced by said comparator,
a digital ramp switch signal register for storing a ramp switch signal count supplied by said ramp switch signal counter,
a control circuit for supplying clock signals to said ramp generator and clock counter, and for supplying actuating signals that increment the ramp switch signal counter and cause the clock register and ramp switch signal register to store the incremented contents of said clock and ramp switch signal counters, respectively, in response to the comparator producing a ramp switch signal,
a multiplexer control circuit connected to cause said multiplexer to initially select the ramp with the highest slope, and to thereafter switch to progressively lower slope ramps in response to successive ramp switch signals, and
a readout circuit connected to provide the contents of said clock and ramp switch signal registers as a digital output from the ADC for each of said input samples.

18. The ADC of claim 17, wherein said clock counter counts up from an initial minimum value, and said ramp switch signal counter counts down from an initial maximum value.

19. The ADC of claim 18, wherein said readout circuit reads out the contents of said ramp switch signal register as the most significant bits of the digital output, and the contents of said clock register as the least significant bits of the digital output.

20. The ADC of claim 17, said ramp generator comprising an operational amplifier (op amp) having a non-inverting input connected to a voltage reference and an inverting input connected to its output through a feedback capacitor, a charging circuit for charging said feedback capacitor with substantially equal charge increments at the clock rate to generate a voltage ramp at the op amp output, and an R-2R ladder network connected to the op amp output to decrement said voltage ramp into ramps with progressively lower slopes.

21. The ADC of claim 17, said ramp connect circuit including a pre-amplifier circuit that receives the selected voltage ramp and the input sample, and presents a differential signal to the comparator that represents the difference between the selected voltage ramp and the input sample up to a predetermined maximum differential signal level.

22. The ADC of claim 17, further including an acceleration circuit that controls said multiplexer to select the lowest order ramp, skipping over any intervening ramps, in response to the highest order ramp exceeding the input signal sample for the first clock count.

23. The ADC of claim 17, further including a ramp switch inhibit circuit that inhibits the multiplexer from switching to a lower order ramp in response to the second of two consecutive ramp switch signals from the comparator.

24. A method of converting an input analog signal to an output digital signal, comprising:
generating a plurality of analog signal ramps with progressively increasing signal-time slopes,
comparing the input signal with the highest order ramp,
switching to a lower order ramp for comparison with the input signal each time the current ramp exceeds the input signal, for a predetermined cycle period,
counting the number of ramp switching events during a given cycle, counting the elapsed time between the beginning of the cycle and the most recent ramp switching event prior to the end of the cycle, and generating an output digital signal based upon said ramp switching event and elapsed time counts.

25. The method of claim 24, wherein said elapsed time count counts up from an initial minimum value, and said ramp switching event count counts down from an initial maximum value.

26. The method of claim 25, wherein said output digital signal is generated with said ramp switching event count as its most significant bits and said elapsed time count as its least significant bits.

27. The method of claim 24, wherein said ramps are generated under the control of a periodic clock signal, and a switch is made from the highest order ramp to the lowest order ramp, skipping the intervening ramps, in response to the highest order ramp exceeding the input signal for the first clock count.

28. The method of claim 24, wherein said ramps are generated under the control of a period clock signal, and a ramp switch is inhibited the second time a ramp exceeds the input signal in response to the ramp exceeding the input signal for two consecutive clock counts.

29. The method of claim 24, wherein said plurality of analog signal ramps are generated simultaneously.

30. The method of claim 24, wherein only the analog signal ramp that is compared with the input signal is generated at any given time.

* * * * *